(12) United States Patent
Namiki et al.

(10) Patent No.: US 10,641,227 B2
(45) Date of Patent: May 5, 2020

(54) ELECTRIC POWER SYSTEM

(71) Applicant: Honda Motor Co., Ltd., Tokyo (JP)

(72) Inventors: Shigeru Namiki, Saitama (JP); Yuki Koizumi, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 99 days.

(21) Appl. No.: 16/048,371

(22) Filed: Jul. 30, 2018

(65) Prior Publication Data

US 2019/0040832 A1 Feb. 7, 2019

(30) Foreign Application Priority Data

Aug. 3, 2017 (JP) .................................. 2017-150533

(51) Int. Cl.
*F02N 11/08* (2006.01)
*G07C 5/08* (2006.01)
*G01R 31/367* (2019.01)

(52) U.S. Cl.
CPC ........ *F02N 11/0825* (2013.01); *G01R 31/367* (2019.01); *G07C 5/0808* (2013.01); *F02N 2200/061* (2013.01); *F02N 2200/0801* (2013.01); *F02N 2200/101* (2013.01); *F02N 2200/102* (2013.01); *F02N 2300/30* (2013.01)

(58) Field of Classification Search
CPC ............. F02N 11/0825; F02N 11/0862; F02N 11/0818; F02N 11/10; F02N 2200/061; G07C 5/0808; G01R 31/367; G01R 31/382; G01R 31/387

See application file for complete search history.

(56) References Cited

U.S. PATENT DOCUMENTS

| | | | | |
|---|---|---|---|---|
| 10,300,807 B2* | 5/2019 | Jin | .......................... | B60L 58/16 |
| 2014/0058595 A1* | 2/2014 | Li | .......................... | H01M 10/42 |
| | | | | 701/22 |
| 2014/0095089 A1* | 4/2014 | Wu | .................... | G01R 31/3648 |
| | | | | 702/63 |
| 2014/0347059 A1* | 11/2014 | Sato | ...................... | H02J 7/0021 |
| | | | | 324/430 |
| 2016/0003919 A1* | 1/2016 | Hirschbold | ......... | F02N 11/0825 |
| | | | | 324/433 |

(Continued)

FOREIGN PATENT DOCUMENTS

JP 2011149345 8/2011

*Primary Examiner* — Sizo B Vilakazi
*Assistant Examiner* — Anthony L Bacon
(74) *Attorney, Agent, or Firm* — JCIPRNET

(57) ABSTRACT

Provided is an electric power system mounted on a vehicle having an engine, a battery, and a starter that starts the engine. The electric power system includes an SOC estimation part, estimating the SOC of the battery based on a first algorithm; an idling stop control part, permitting implementation of an idling stop control when an estimation result of the SOC estimation part satisfies a predetermined automatic stop condition; a full charge determination part, determining whether the battery is in a full charge state based on a second algorithm different from the first algorithm; and a malfunction determination part, determining that malfunction occurs in the SOC estimation part when the battery is estimated in the full charge state by the full charge determination part and the estimation result of the SOC estimation part does not satisfy the automatic stop condition.

18 Claims, 2 Drawing Sheets

(56) References Cited

U.S. PATENT DOCUMENTS

| | | | |
|---|---|---|---|
| 2016/0009194 A1* | 1/2016 | Katayama | B60L 58/14 |
| | | | 320/109 |
| 2016/0167520 A1* | 6/2016 | Sekizaki | B60L 3/0038 |
| | | | 701/22 |
| 2017/0114741 A1* | 4/2017 | Ito | F02N 11/0825 |
| 2018/0050681 A1* | 2/2018 | Ohkawa | B60L 58/12 |
| 2018/0093659 A1* | 4/2018 | Fukuda | B60W 10/26 |

* cited by examiner

ELECTRIC POWER SYSTEM

CROSS-REFERENCE TO RELATED APPLICATION

This application claims the priority of Japan patent application serial no. 2017-150533, filed on Aug. 3, 2017. The entirety of the above-mentioned patent application is hereby incorporated by reference herein and made a part of this specification.

BACKGROUND

1. Field of the Invention

The disclosure relates to an electric power system. In particular, the disclosure relates to an electric power system mounted on a vehicle which is provided with an internal-combustion engine, a battery and a starter.

2. Description of Related Art

Most vehicles, which use an internal combustion engine as a power-generating source to run, have a so-called idling stop function to suppress fuel consumption in the internal combustion engine. The idling stop function is a function which temporarily stops the internal combustion engine when a predetermined automatic stop condition is satisfied and then restarts the internal-combustion engine when a predetermined automatic return condition is satisfied.

Meanwhile, when the internal combustion engine is restarted, a crankshaft of the internal combustion engine is driven by a starter, and the power consumption of the starter may be obtained from a battery that supplies the electric power to vehicle auxiliary machines (light, air conditioner, navigation system, etc.). For this reason, if the charging rate (a ratio represented by percentage showing the ratio of a remaining capacity of the battery with respect to a full charge capacity, also referred to as "SOC (State Of Charge)" hereinafter) of the battery is insufficient during restart, there is a risk that other vehicle auxiliary machines may not operate normally due to a voltage reduction during the restart. As a result, in most vehicles, implementation of idling stop control is prohibited when the SOC of the battery does not reach a predetermined permissible SOC (for example, see patent document 1, Japanese Laid-open No. 2011-149345).

Here, an algorithm that estimates the SOC of the battery may be, for example, a method that estimates the SOC based on a correlation between an open voltage and the SOC of the battery, or a method that estimates by accumulating a current flowing in and out of the battery, etc. However, if any malfunction occurs in a module using these algorithms to estimate the SOC, or errors accumulate during the process of SOC calculation, there is a risk that the SOC cannot be estimated accurately. Besides, if the SOC cannot be estimated with proper accuracy, there is a risk that implementation of idling stop control cannot be prohibited or permitted in proper timing, and fuel consumption cannot be improved.

SUMMARY

The disclosure provides an electric power system capable of determining whether the SOC of the battery can be estimated with proper accuracy.

The electric power system of the disclosure controls an internal-combustion engine based on the state of a battery. The electric power system comprises a first charging state estimation part, which estimates the charging state of the battery based on a first algorithm; an idling stop control part, which permits implementation of an idling stop control that temporarily stops the internal-combustion engine when an estimation result of the first charging state estimation part satisfies a permissible condition, and prohibits the implementation of the idling stop control when the permissible condition is not satisfied; a second charging state estimation part, which estimates the charging state of the battery based on a second algorithm different from the first algorithm; and a malfunction determination part, which determines that malfunction occurs in an estimation of the charging state of the battery when an estimation result of the second charging state estimation part satisfies a predetermined condition and the estimation result of the first charging state estimation part does not satisfy the permissible condition.

DESCRIPTION OF THE EMBODIMENTS

Figure 1:
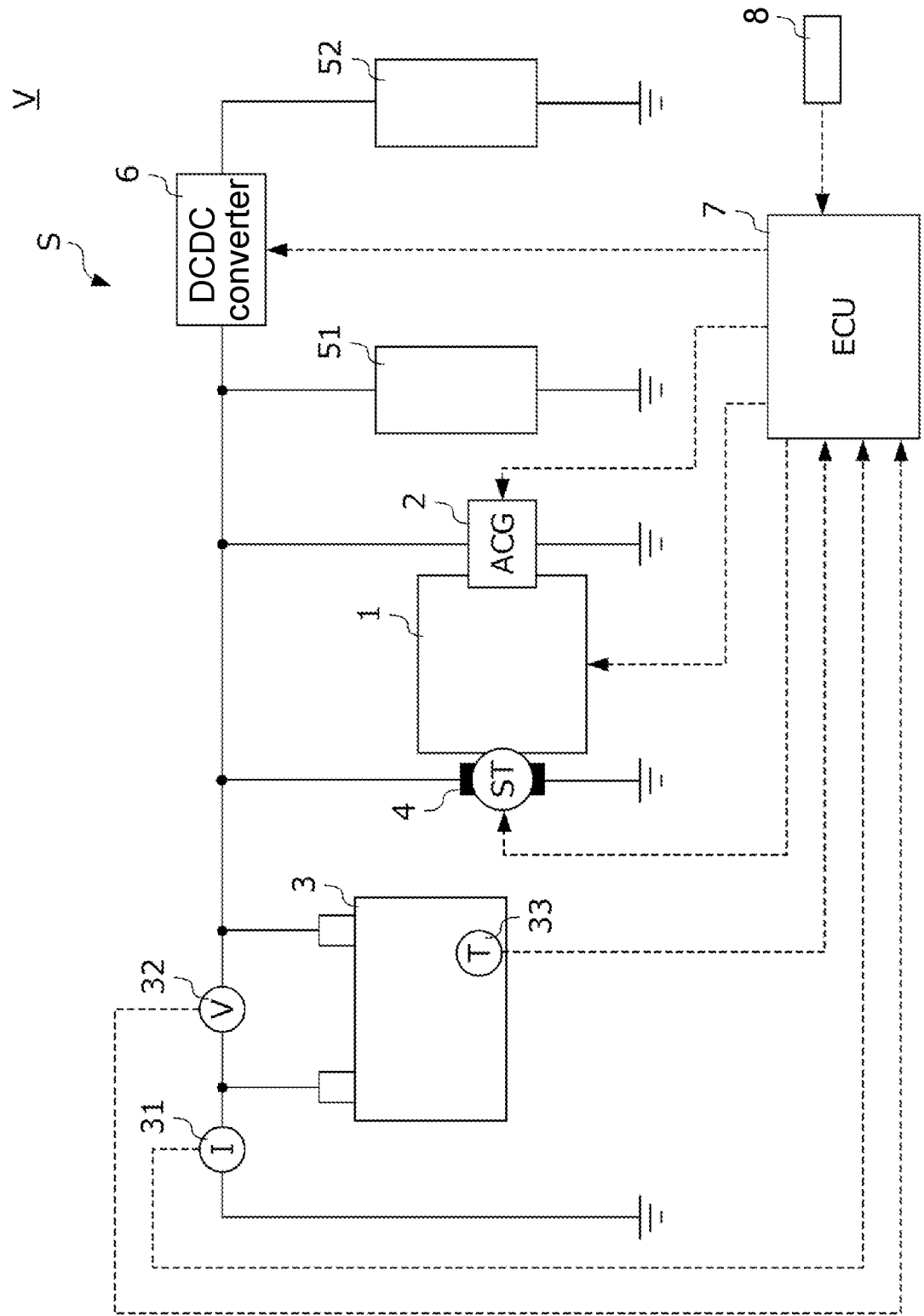
FIG. 1 is a diagram showing structures of an electric power system of an embodiment of the invention and a vehicle on which the electric power system is mounted.

In the following part, an embodiment of the disclosure is described with reference to drawings. FIG. 1 is a diagram showing structures of an electric power system S of the embodiment and a vehicle V on which the electric power system S is mounted.

The electric power system S comprises an alternator 2 (referred to as "ACG 2" hereinafter), a battery 3, a starter 4, a first electric load 51, a DCDC converter 6, a second electric load 52, an ECU 7 and an ignition switch 8. The alternator 2 utilizes a power of an internal-combustion engine 1 (referred to as "engine 1" hereinafter) that is a power-generating source of the vehicle V to generate electric power. The battery 3 may be charged by an electric power generated by the ACG 2. The starter 4 starts the engine 1 using the electric power supplied from the battery 3. The first electric load 51 may use the electric power supplied from the battery 3 to operate. The DCDC converter 6 increases or decreases a voltage of the direct-current electric power of the battery 3. The second electric load 52 is connected to the battery 3 via the DCDC converter 6. The ECU 7 is an electronic control module that controls the above elements. The ignition switch 8 is operated when a driver starts or stops the vehicle V.

The ACG 2 is connected to a crankshaft of the engine 1 via a belt (not shown) and generates electric power by being rotation-driven by the crankshaft. The ACG 2 comprises a regulator or a rotor coil, etc. The ECU 7 adjusts a current flowing in the rotor coil by controlling a switch of the regulator to be turned ON or OFF, and adjusts the electric power generated by the ACG 2. The ECU 7 adjusts the electric power generated by the ACG 2 so that the SOC of the battery 3 estimated by an SOC estimation part 71 described below is substantially maintained at a predetermined target SOC. In addition, an output voltage of the ACG 2 is set higher than the voltage of the battery 3 so that the battery 3 can be charged by the electric power generated by the ACG 2.

The battery 3 is a secondary battery capable of a discharge which converts chemical energy to electric energy and a charge which converts electric energy to chemical energy. In this embodiment, a situation in which a lead battery using lead in an electrode is used as the battery 3 is described, but the disclosure is not limited to this. A so-called lithium ion battery which performs charge and discharge by movement of the lithium ions between the electrodes may also be used as the battery 3.

A plurality of sensors 31, 32, 33 is arranged on the battery 3 to grasp the charging state of the battery 3 in the ECU 7. The battery current sensor 31 detects the current flowing in the battery 3 and transmits a signal corresponding to the detection value to the ECU 7. The battery voltage sensor 32 detects a voltage among terminals between positive and negative electrodes of the battery 3 and transmits a signal corresponding to the detection value to the ECU 7. The battery temperature sensor 33 detects a temperature of the battery 3 and transmits a signal corresponding to the detection value to the ECU 7.

The starter 4 is a cell motor which starts the engine 1 by the electric power supplied from the battery 3. When the driver turns the ignition switch 8 on to start the vehicle V or restarts the engine 1 after performing an idling stop control described below, the ECU 7 supplies the electric power from the battery 3 to the starter 4 and starts the engine 1.

The electric loads 51, 52 comprise various electronic machines mounted on the vehicle V, for example, lights, air conditioners, navigation systems, electric power steering, and acoustic equipment.

The ECU 7 comprises an I/O interface sensor, a RAM or ROM, a CPU and a drive circuit. The I/O interface sensor performs A/D conversion to the detection signal. The RAM or ROM stores various control programs or data, etc. The CPU executes various arithmetic processing accordingly to the aforementioned programs. The drive circuit drives the engine 1, the ACG 2, the starter 4 and the DCDC converter 6, etc., according to the arithmetic processing result of the CPU.

Figure 2:
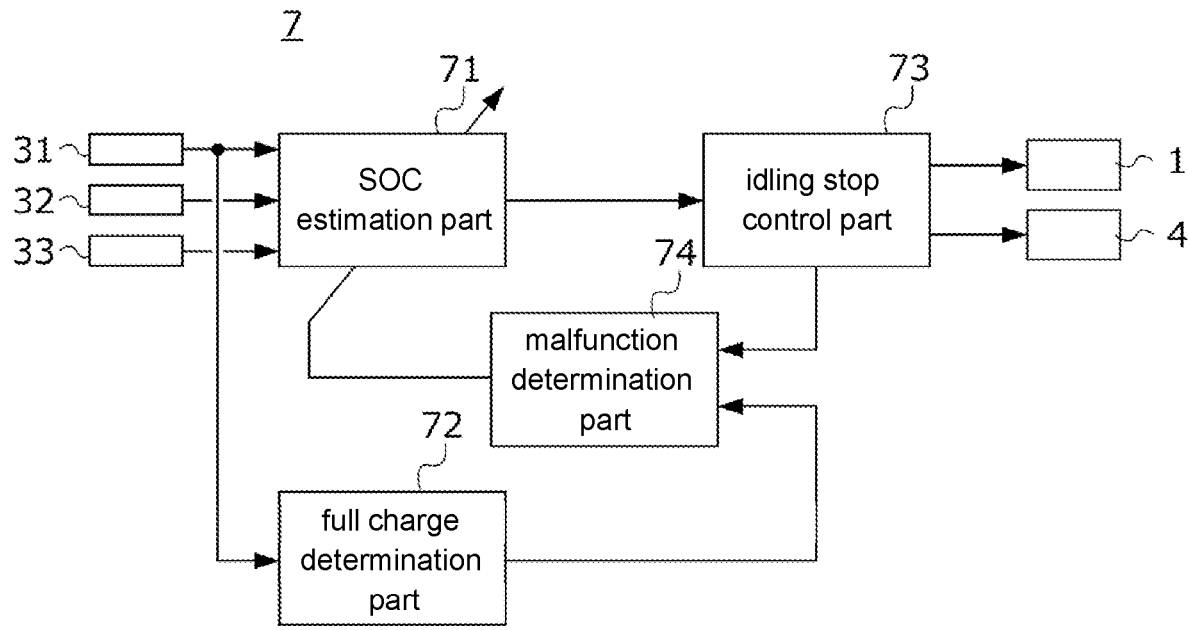
FIG. 2 is a function block diagram showing the structure of an ECU.

FIG. 2 is a function block diagram which functionally shows the configuration of the ECU 7. The ECU 7 comprises an SOC estimation part 71, a full charge determination part 72, an idling stop control part 73 and a malfunction determination part 74. In addition, the SOC estimation part 71, the full charge determination part 72, the idling stop control part 73, and the malfunction determination part 74 are realized by executing a program in the ECU 7 having the aforementioned hardware configuration.

The SOC estimation part 71 uses the detection signals from sensors 31-33 to estimate the SOC, which is a parameter representing the charging state of the battery 3, based on a predetermined first algorithm. Here, existing SOC estimation algorithm, such as a so-called OCV-SOC method which estimates the SOC based on a correlation relationship between an open circuit voltage (OCV) and the SOC of the battery 3, or a coulomb count method which estimates the SOC by accumulating the current flowing in the battery 3, is used as the first algorithm.

When the OCV-SOC method is adopted as the first algorithm, the SOC estimation part 71 calculates an estimation value of the OCV of the battery 3 based on existing algorithms by using a closed-circuit voltage (CCV) of the battery 3 detected by the battery voltage sensor 32, a current detected by the battery current sensor 31, and a temperature detected by the battery temperature sensor 33. Moreover, an OCV-SOC map showing a relation of the OCV and the SOC of the battery 3 is defined in the SOC estimation part 71 in advance, and the SOC estimation part 71 calculates the estimation value of the SOC of the battery 3 by using the estimation value of the OCV calculated as mentioned above to search the aforementioned OCV-SOC map.

When the coulomb count method is adopted as the first algorithm, the SOC estimation part 71 takes, for example, the charging current flowing into the battery 3 as positive, takes the discharging current flowing out of the battery 3, which is opposite to the charging current, as negative, and calculates the estimation value of the SOC of the battery 3 by calculating the accumulated value of the current detected by the battery current sensor 31.

In addition, the SOC estimation part 71 has a function of correcting at least any one of the first algorithm and the parameters used in the first algorithm according to the determination result of a malfunction determination part 74 described below, and this correcting function is described below in detail.

The full charge determination part 72 estimates the charging state of the battery 3 based on a second algorithm different from the first algorithm used in the SOC estimation part 71, without using the SOC estimation result in the SOC estimation part 71. More specifically, the full charge determination part 72 determines whether the battery 3 is in a full charge state based on a change of the current detected by the battery current sensor 31 when the battery 3 is charged using the electric power generated by the ACG 2.

Figure 3:
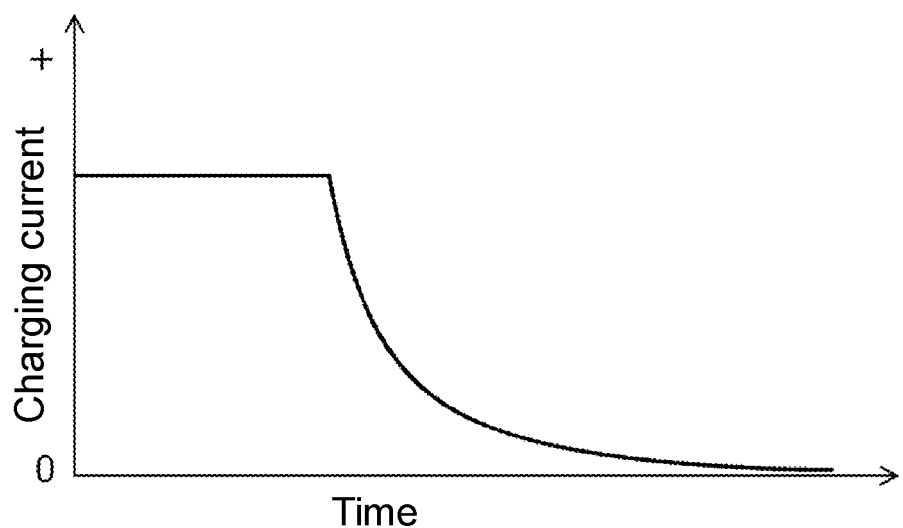
FIG. 3 is a diagram showing a change with time of a charging current of a battery.

As shown in FIG. 3, if the battery 3 is charged while maintaining a constant output voltage of the ACG 2, the charging current flowing into the battery 3 gradually gets close to 0, and the battery 3 gets close to a full charge state. Here, a change with time of the charging current becomes 0 as the battery 3 gets close to the full charge state. Therefore, the full charge determination part 72 uses the current detected by the battery current sensor 31 to calculate the change rate of the charging current, estimates that the battery 3 is in the full charge state when the change rate of the charging current is lower than a threshold set to a value slightly greater than 0, and estimates that the battery 3 is not in the full charge state when the change rate is equal to or larger than the aforementioned threshold.

When all the following automatic stop conditions (a)-(e) are satisfied, the idling stop control part 73 implements the idling stop control which temporarily stops the engine 1.

(a) The ignition switch 8 is turned on.
(b) The vehicle speed is below a starting speed set to be slightly greater than 0.
(c) An accelerator pedal opening is about 0.
(d) A brake pedal is being stamped on.
(e) The estimation value of the SOC calculated by the SOC estimation part 71 is equal to or larger than a predetermined starting threshold.

Besides, after the implementation of the aforementioned idling stop control, the idling stop control part 73 uses the electric power of the battery 3 to drive the starter 4 and restarts the engine 1 when any of the following automatic return conditions (f)-(g) is satisfied.

(f) The brake pedal is not stamped on any more.
(g) The estimation value of the SOC calculated by the SOC estimation part 71 is below an ending threshold set to a value lower than the aforementioned starting threshold.

The malfunction determination part 74 determines whether malfunction occurs in the SOC estimation function of the SOC estimation part 71, that is, determines whether the SOC estimation part 71 can accurately estimate the SOC of the battery 3. Here, an estimation accuracy of the SOC estimation part 71 and the full charge determination part 72 is compared. As mentioned above, in the SOC estimation part 71, the SOC of the battery 3 is estimated based on the SOC-OCV method or the coulomb count method as described above. Therefore, different from the full charge determination part 72, according to the SOC estimation part 71, states of the battery 3 other than the full charge state can also be estimated. However, in the SOC-OCV method, there is a risk that if the battery 3 degenerates, properties reproduced by the SOC-OCV map deviate from the actual properties of the battery 3, and the estimation accuracy of the SOC decreases. Besides, in the coulomb count method, because the accumulated value of the detection value of the battery current sensor 31 is used, there is a risk that errors are accumulated and the estimation accuracy of the SOC is decreased.

In contrast, even though the full charge determination part 72 cannot estimate states other than the full charge state as the SOC estimation part 71 does, the full charge determination part 72 determines whether the battery 3 is in the full charge state based on the change rate of the charging current, so that the full charge determination part 72 can estimate whether the battery 3 is in the full charge state with an accuracy higher than that of the SOC estimation part 71. Therefore, the malfunction determination part 74 takes the determination result of the full charge determination part 72 as a norm and determines whether malfunction occurs in the estimation function of the SOC estimation part 71.

More specifically, when the full charge determination part 72 determines that the battery 3 is in the full charge state and the automatic stop condition (e) defined in the idling stop control part 73 is not satisfied, the malfunction determination part 74 determines that malfunction occurs in the estimation function of the SOC estimation part 71.

In addition, in the malfunction determination part 74, in order to prevent the process from being complicated along with the malfunction determination, whether the automatic stop condition (e) is satisfied in the idling stop control part 73 may be determined only when the full charge determination part 72 determines that the battery 3 is in the full charge state, and when the automatic stop condition (e) is not satisfied, it is determined that malfunction occurs in the SOC estimation function of the SOC estimation part 71.

When the malfunction determination part 74 determines that malfunction occurs, the SOC estimation part 71 corrects at least one of the first algorithm used to estimate the SOC of the battery 3 and the parameters used in the first algorithm to improve the SOC estimation accuracy. For example, the SOC estimation part 71 corrects the first algorithm, etc., so that the estimation result of the full charge determination part 72 is consistent with the estimation result of the SOC estimation part 71. That is, when the full charge determination part 72 estimates that the battery 3 is in the full charge state, the first algorithm, etc., are corrected so that the estimation value of the SOC obtained in the SOC estimation part 71 using the first algorithm is 100[%]. Here, when the SOC-OCV method is adopted as the first algorithm, the SOC estimation part 71 corrects the first algorithm by revising the SOC-OCV map for example. Besides, when the coulomb count method is adopted as the first algorithm, the SOC estimation part 71 corrects the parameters used in the first algorithm by adding a predetermined value to the accumulated value of the current of the battery 3.

Moreover, the idling stop control part 73 may also loosen the automatic stop condition (e) when the malfunction determination part 74 determines that malfunction occurs, so that the implementation of the idling stop control is easily permitted. More specifically, when the malfunction determination part 74 determines that malfunction occurs, the idling stop control part 73 may also make it easy to permit the implementation of the idling stop control by decreasing the starting threshold in the automatic stop condition (e). As a result, the burden to the battery 3 can be decreased, and it can contribute to improving the fuel consumption.

According to the electric power system S of this embodiment, the following effects can be achieved.

(1) The electric power system S comprises: the SOC estimation part 71, which estimates the SOC of the battery 3 based on the first algorithm; the full charge determination part 72, which determines whether the battery 3 is in the full charge state based on the second algorithm different from the first algorithm; and the idling stop control part 73, which permits the implementation of the idling stop control when the estimation result of the SOC estimation part 71 satisfies the automatic stop condition (e), and prohibits the implementation of the idling stop control when the automatic stop condition (e) is not satisfied. Besides, when it is determined by the full charge determination part 72 that the battery 3 is in the full charge state and the estimation result of the SOC estimation part 71 does not satisfy the automatic stop condition (e), the malfunction determination part 74 determines that malfunction occurs in the SOC estimation part 71. That is, according to the electric power system S, when there is a contradiction between the estimation result of the SOC estimation part 71 used to determine whether to implement the idling stop control or not and the estimation result of the full charge determination part 72 based on an algorithm different from the SOC estimation part 71, it can be determined that malfunction occurs in the SOC estimation of the SOC estimation part 71. Besides, by performing a malfunction determination based on whether the permissible condition for permitting or prohibiting the implementation of the idling stop control is satisfied, the malfunction determination can help to improve the fuel consumption.

(2) When the full charge determination part 72 determines that the battery 3 is in the full charge state, the malfunction determination part 74 determines whether the estimation result of the SOC estimation part 71 satisfies the automatic stop condition (e), that is, determines whether malfunction occurs in the SOC estimation of the SOC estimation part 71. In this way, because the timing of performing malfunction determination in the malfunction determination part 74 can be narrowed down, the process can be prevented from being complicated along with the malfunction determination.

(3) In the electric power system S, when the estimation result of the SOC estimation part 71 does not satisfy the automatic stop condition (e) even though the full charge determination part 72 determines that the battery 3 is in the full charge state, that is, when the implementation of the idling stop control is prohibited, it is determined that malfunction occurs in the SOC estimation of the SOC estimation part 71. That is, in the electric power system S, by preparing a part which can be specified to estimate whether the battery 3 is in the full charge state as the full charge determination part 72, malfunction occurring in the SOC estimation part 71 can be determined.

(4) In the electric power system S, when the full charge determination part 72 determines that the battery 3 is in the full charge state and the estimation result of the SOC estimation part 71 does not satisfy the automatic stop condition (e), it is determined that malfunction occurs in the SOC estimation function of the SOC estimation part 71. In this way, the reason for malfunction can be specified, and further it can handle that the SOC can be estimated correctly by the SOC estimation part 71.

(5) When the full charge determination part 72 determines that the battery 3 is in the full charge state and the estimation value of the SOC calculated by the SOC estimation part 71 is not equal to or larger than the starting threshold (that is, the automatic stop condition (e) is not satisfied), the malfunction determination part 74 determines that malfunction occurs in the estimation function of the SOC estimation part 71. Besides, when the malfunction determination part 74 determines that malfunction occurs, the idling stop control part 73 decreases the starting threshold in the automatic stop condition (e) and corrects the automatic stop condition (e) so that the implementation of the idling stop control is easily permitted. In this way, the burden to the battery 3 can be decreased, and it can contribute to improving the fuel consumption.

(6) When the malfunction determination part 74 determines that malfunction occurs, the SOC estimation part 71 corrects at least one of the first algorithm and the parameters used in the first algorithm. As a result, the SOC of the battery 3 can be accurately estimated by the SOC estimation part 71.

(7) The SOC estimation part 71 estimates the SOC of the battery 3 by using the OCV-SOC map associating the OCV and the SOC of the battery 3 and revises the OCV-SOC map when the malfunction determination part 74 determines that malfunction occurs. As a result, malfunction in the SOC estimation part 71 is dissolved, and then the SOC of the battery 3 can be estimated accurately.

(8) The SOC estimation part 71 estimates the SOC by calculating the accumulated value of the charging current and the discharging current of the battery 3 and adds a predetermined value to the accumulated value when the malfunction determination part 74 determines that malfunction occurs. As a result, malfunction in the SOC estimation part 71 is dissolved, and then the SOC of the battery 3 is estimated accurately.

(9) When the change rate of the charging current of the battery 3 is lower than the threshold set to a value slightly greater than 0, the full charge determination part 72 determines that the battery 3 is in the full charge state. As a result, in the full charge determination part 72, even if the charging state of the battery 3 cannot be estimated in detail, whether the battery 3 is in the full charge state can be accurately estimated. In the electric power system S, by using such a full charge determination part 72, malfunction in the function of the SOC estimation part 71 can be accurately determined.

The embodiment of the disclosure is described as above, but the disclosure is not limited to this. Detailed structure may be properly modified within the scope of the spirit of the disclosure.

For example, in the aforementioned embodiment, it describes that the first algorithm, etc. in the SOC estimation part 71 are corrected, or the starting threshold in the automatic stop condition (e) is decreased when the malfunction determination part 74 determines that malfunction occurs. However, the action performed after the malfunction determination is not limited to this. For example, when the malfunction determination part 74 determines that malfunction occurs, after the first algorithm, etc. are corrected as mentioned above, the ECU 7 may charge the battery 3 until the corrected SOC estimation part 71 determines that the battery 3 is in the full charge state. As a result, even when malfunction occurs in the estimation function of the SOC estimation part 71, the battery 3 can also be fully charged.

GENERAL DESCRIPTION

The electric power system (for example, an electric power system S described above) of the disclosure controls an internal-combustion engine (for example, an engine 1 described above) based on the state of a battery (for example, a battery 3 described above). The electric power system comprises a first charging state estimation part (for example, an SOC estimation part 71 described above), which estimates the charging state of the battery based on a first algorithm; an idling stop control part (for example, an idling stop control part 73 described above), which permits implementation of an idling stop control that temporarily stops the internal-combustion engine when an estimation result of the first charging state estimation part satisfies a permissible condition (for example, an automatic stop condition (e) described above), and prohibits the implementation of the idling stop control when the permissible condition is not satisfied; a second charging state estimation part (for example, a full charge determination part 72 described above), which estimates the charging state of the battery based on a second algorithm different from the first algorithm; and a malfunction determination part (for example, a malfunction determination part 74 described above), which determines that malfunction occurs in an estimation of the charging state of the battery when an estimation result of the second charging state estimation part satisfies a predetermined condition and the estimation result of the first charging state estimation part does not satisfy the permissible condition.

(2) In an embodiment, the malfunction determination part determines whether the estimation result of the first charging state estimation part satisfies the permissible condition when the estimation result of the second charging state estimation part satisfies the predetermined condition.

(3) In an embodiment, the predetermined condition is satisfied when the battery is estimated in a full charge state by the second charging state estimation part.

(4) In an embodiment, the malfunction determination part determines that malfunction occurs in the first charging state estimation part when the estimation result of the second charging state estimation part satisfy the predetermined condition and the estimation result of the first charging state estimation part does not satisfy the permissible condition.

(5) In an embodiment, the permissible condition is satisfied when the charging rate of the battery is estimated to be equal or larger than a predetermined threshold by the first charging state estimation part, and the idling stop control part preferably decreases the predetermined threshold when the malfunction determination part determines that malfunction occurs.

(6) In an embodiment, the first charging state estimation part corrects at least one of the first algorithm and the parameters used in the first algorithm when the malfunction determination part determines that malfunction occurs.

(7) In an embodiment, the first algorithm is an estimation method that estimates the charging state of the battery by using a map that associates the open voltage of the battery with the charging state of the battery, and the first charging state estimation part preferably revises the map when the malfunction determination part determines that malfunction occurs.

(8) In an embodiment, the first algorithm is an estimation method that estimates the charging state of the battery by calculating an accumulated value of a charging current and a discharging current opposite to the charging current of the battery, and the first charging state estimation part preferably adds a predetermined value to the accumulated value when the malfunction determination part determines that malfunction occurs.

(9) In an embodiment, the electric power system further comprises a charge control part (for example, an ECU 7 described above) that charges the battery until the first charging state estimation part determines that the battery is in the full charge state, when the malfunction determination part determines by that malfunction occurs.

(10) In an embodiment, the second charging state estimation part estimates that the battery is in the full charge state when a change rate of the charging current of the battery is lower than the threshold set to a value slightly greater than 0.

EFFECTS (1) The electric power system of the disclosure is provided with the first charging state estimation part, estimating the charging state of the battery based on the first algorithm; the second charging state estimation part, estimating the charging state of the battery based on the second algorithm different from the first algorithm; and the idling stop control part, permitting the implementation of the idling stop control when the estimation result of the first charging state estimation part satisfies the permissible condition, and prohibits the implementation of the idling stop control when the permissible condition is not satisfied. Besides, the malfunction determination part determines that malfunction occurs in the estimation of the charging state of the battery when the estimation result of the second charging state estimation part satisfies the predetermined condition and the estimation result of the first charging state estimation part does not satisfy the permissible condition. That is, according to the disclosure, when there is a contradiction between the estimation result of the first charging state estimation part used to determine whether to implement the idling stop control or not and the estimation result of the second charging state estimation part based on an algorithm different from the first charging state estimation part, it can be determined that malfunction occurs in the estimation of the charging state of the battery. Besides, by performing a malfunction determination based on whether the permissible condition for permitting or prohibiting the implementation of the idling stop control is satisfied, the malfunction determination can help to improve the fuel consumption.

(2) When the estimation result of the second charging state estimation part satisfies the predetermined condition, the malfunction determination part in the disclosure determines whether the estimation result of the first charging state estimation part satisfies the permissible condition, that is, determines whether malfunction occurs in the estimation of the charging state of the battery. As a result, because the timing of performing malfunction determination in the malfunction determination part can be narrowed down, process can be prevented from being complicated along with the malfunction determination.

(3) In the disclosure, when the estimation result of the first charging state estimation part does not satisfy the permissible condition even though it is estimated by the second charging state estimation part that the battery is in a full charge state, that is, when the implementation of the idling stop control is prohibited, it is determined that malfunction occurs in the estimation of the charging state of the battery. That is, in the disclosure, by preparing a part which can be specified in estimating whether the battery is in a full charge state as the second charging state estimation part, malfunction occurring in the first charging state estimation part can be determined.

(4) In the disclosure, when the estimation result of the second charging state estimation part satisfies the predetermined condition and the estimation result of the first charging state estimation part does not satisfy the permissible condition, it is determined that malfunction occurs in the first charging state estimation part. As a result, the reason for malfunction can be specified, and further it can handle that the charging state can be estimated correctly by the first charging state estimation part.

(5) When the estimation result of the second charging state estimation part satisfies the predetermined condition and the first charging state estimation part estimates that the charging rate of the battery is equal to or larger than the predetermined threshold, the malfunction determination part of the disclosure determines that malfunction occurs in the estimation of the charging state of the battery. Besides, when the malfunction determination part determines that malfunction occurs, the idling stop control part decreases the predetermined threshold to a charge amount of the battery and corrects the permissible condition is corrected so that the implementation of the idling stop control is easily permitted. As a result, the burden to the battery can be decreased, and it can contribute to improving the fuel consumption.

(6) When the malfunction determination part determines that malfunction occurs, the first charging state estimation part of the disclosure corrects at least one of the first algorithm and the parameters used in the first algorithm. As a result, the charging state of the battery can be accurately estimated by the first charging state estimation part.

(7) When the charging state of the battery is estimated by using the map associating the open voltage with the charging state, and the malfunction determination part determines that malfunction occurs, the first charging state estimation part of the disclosure revises the map. As a result, malfunction in the first charging state estimation part is dissolved, and then the charging state of the battery can be estimated accurately.

(8) When the charging state is estimated by calculating the accumulated value of the charging current and the discharging current of the battery, and the malfunction determination part determines that malfunction occurs, the first charging state estimation part of the disclosure adds a predetermined value to the accumulated value. As a result, malfunction in the first charging state estimation part is dissolved, and then the charging state of the battery can be estimated accurately.

(9) In the disclosure, when the malfunction determination part determines that malfunction occurs, the battery is charged until the first charging state estimation part determines that the battery is in a full charge state. As a result, even if malfunction occurs in the estimation of the charging state of the battery, the battery can be fully charged.

(10) When the change rate of the charging current of the battery is lower than the threshold set to a value slightly greater than 0, the second charging state estimation part of the disclosure estimates that the battery is in a full charge state. As a result, in the second charging state estimation part, even if the charging state of the battery cannot be estimated in detail, whether the battery is in a full charge state can be accurately estimated. In the disclosure, by using such second charging state estimation part, malfunction of the first charging state estimation part can be accurately determined.

What is claimed is:

1. An electric power system that controls an internal-combustion engine based on a state of a battery, comprising:

a first charging state estimation part, estimating a charging state of the battery based on a first algorithm;

an idling stop control part, permitting an implementation of an idling stop control which temporarily stops the internal-combustion engine when an estimation result of the first charging state estimation part satisfies a permissible condition, and prohibits the implementation of the idling stop control when the permissible condition is not satisfied;

a second charging state estimation part, estimating the charging state of the battery based on a second algorithm different from the first algorithm; and a malfunction determination part, determining that malfunction occurs in an estimation of the charging state of the battery when an estimation result of the second charging state estimation part satisfies a predetermined condition and the estimation result of the first charging state estimation part does not satisfy the permissible condition.

2. The electric power system according to claim 1, wherein when the estimation result of the second charging state estimation part satisfies the predetermined condition, the malfunction determination part determines whether the estimation result of the first charging state estimation part satisfy the permissible condition.

3. The electric power system according to claim 1, wherein the predetermined condition is satisfied when the battery is estimated in a full charge state by the second charging state estimation part.

4. The electric power system according to claim 1, wherein when the estimation result of the second charging state estimation part satisfies the predetermined condition and the estimation result of the first charging state estimation part does not satisfy the permissible condition, the malfunction determination part determines that malfunction occurs in the first charging state estimation part.

5. The electric power system according to claim 1, wherein the permissible condition is satisfied when the charging rate of the battery is estimated to be equal or larger than a predetermined threshold by the first charging state estimation part, and the idling stop control part decreases the predetermined threshold when the malfunction determination part determines that malfunction occurs.

6. The electric power system according to claim 1, wherein when the malfunction determination part determines that malfunction occurs, the first charging state estimation part corrects at least one of the first algorithm and parameters used in the first algorithm.

7. The electric power system according to claim 6, wherein the first algorithm is an estimation method that estimates the charging state of the battery by using a map associating an open voltage of the battery with the charging state of the battery, and the first charging state estimation part revises the map when the malfunction determination part determines that malfunction occurs.

8. The electric power system according to claim 6, wherein the first algorithm is an estimation method that estimates the charging state of the battery by calculating an accumulated value of a charging current of the battery and a discharging current opposite to the charging current, and the first charging state estimation part adds a predetermined value to the accumulated value when the malfunction determination part determines that malfunction occurs.

9. The electric power system according to claim 1, further comprising a charge control part that charges the battery until the first charging state estimation part determines that the battery is in the full charge state, when the malfunction determination part determines that malfunction occurs.

10. The electric power system according to claim 1, wherein when a change rate of the charging current of the battery is lower than a threshold set to a value slightly greater than 0, the second charging state estimation part estimates that the battery is in the full charge state.

11. The electric power system according to claim 2, wherein the predetermined condition is satisfied when the battery is estimated in a full charge state by the second charging state estimation part.

12. The electric power system according to claim 2, wherein when the estimation result of the second charging state estimation part satisfies the predetermined condition and the estimation result of the first charging state estimation part does not satisfy the permissible condition, the malfunction determination part determines that malfunction occurs in the first charging state estimation part.

13. The electric power system according to claim 2, wherein the permissible condition is satisfied when the charging rate of the battery is estimated to be equal or larger than a predetermined threshold by the first charging state estimation part, and the idling stop control part decreases the predetermined threshold when the malfunction determination part determines that malfunction occurs.

14. The electric power system according to claim 2, wherein when the malfunction determination part determines that malfunction occurs, the first charging state estimation part corrects at least one of the first algorithm and parameters used in the first algorithm.

15. The electric power system according to claim 14, wherein the first algorithm is an estimation method that estimates the charging state of the battery by using a map associating an open voltage of the battery with the charging state of the battery, and the first charging state estimation part revises the map when the malfunction determination part determines that malfunction occurs.

16. The electric power system according to claim 14, wherein the first algorithm is an estimation method that estimates the charging state of the battery by calculating an accumulated value of a charging current of the battery and a discharging current opposite to the charging current, and the first charging state estimation part adds a predetermined value to the accumulated value when the malfunction determination part determines that malfunction occurs.

17. The electric power system according to claim 2, further comprising a charge control part that charges the battery until the first charging state estimation part determines that the battery is in the full charge state, when the malfunction determination part determines that malfunction occurs.

18. The electric power system according to claim 2, wherein when a change rate of the charging current of the battery is lower than a threshold set to a value slightly greater than 0, the second charging state estimation part estimates that the battery is in the full charge state.

* * * * *